(12) United States Patent
Ha

(10) Patent No.: US 11,803,307 B2
(45) Date of Patent: Oct. 31, 2023

(54) MEMORY SYSTEM AND OPERATING METHOD THEREOF

(71) Applicant: SK hynix Inc., Icheon-si (KR)

(72) Inventor: Byung Min Ha, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 26 days.

(21) Appl. No.: 17/519,868

(22) Filed: Nov. 5, 2021

(65) Prior Publication Data

US 2022/0214817 A1     Jul. 7, 2022

(30) Foreign Application Priority Data

Jan. 7, 2021   (KR) .......................... 10-2021-0001784

(51) Int. Cl.
*G06F 3/06* (2006.01)
(52) U.S. Cl.
CPC .......... *G06F 3/0619* (2013.01); *G06F 3/0611* (2013.01); *G06F 3/0659* (2013.01); *G06F 3/0679* (2013.01)
(58) Field of Classification Search
None
See application file for complete search history.

(56) References Cited

U.S. PATENT DOCUMENTS

| | | | |
|---|---|---|---|
| 3,757,302 A * | 9/1973 | Pollitt | G01R 31/52 714/36 |
| 10,810,096 B2 * | 10/2020 | Allen | G06F 11/1438 |
| 2015/0188527 A1 * | 7/2015 | Francom | G11C 7/222 327/158 |
| 2019/0026185 A1 * | 1/2019 | Raja | G06F 11/2035 |

FOREIGN PATENT DOCUMENTS

| | | |
|---|---|---|
| KR | 20170111349 A | 10/2017 |
| KR | 20180126118 A | 11/2018 |
| KR | 20190056862 A | 5/2019 |

* cited by examiner

*Primary Examiner* — Michael Alsip
(74) *Attorney, Agent, or Firm* — Perkins Coie LLP

(57) ABSTRACT

A memory system includes a delay time determining unit and a recovering unit. The delay time determining unit determines an amount of a delay time for delaying a recovery operation upon an occurrence of an abnormal power event in the memory system. The recovering unit is in communication with the delay time determining unit to receive information related to the delay time and performs the recovery operation after lapse of an amount of time equal to the delay time.

15 Claims, 8 Drawing Sheets

MEMORY SYSTEM AND OPERATING METHOD THEREOF

CROSS-REFERENCES TO RELATED APPLICATION

This patent document claims the priority and benefits of Korean application number 10-2021-0001784, filed on Jan. 7, 2021, which is incorporated herein by reference in its entirety as part of the disclosure of this patent document.

TECHNICAL FIELD

The technology and implementations disclosed in this patent document generally relate to a memory system, and more particularly to a memory system including a nonvolatile memory device.

BACKGROUND

Memory systems are used to store information for use in a computer or related electronic devices. Memory systems may store data provided from a host device in response to a write request from the host device and provide stored data to the host device in response to a read request from the host device. The host device can be any electronic device that writes or reads data to or from a memory system, such as a computer, a digital camera, a mobile phone and so forth. The memory system may be at the host device side or may be in communication with the host device.

SUMMARY

The technology disclosed in this patent document can be implemented in various embodiments to provide a memory system that includes a delay time determining unit and a recovering unit. The delay time determining unit may determine an amount of a delay time for delaying a recovery operation upon an occurrence of an abnormal power event in the memory system. The recovering unit may be in communication with the delay time determining unit to receive information related to the delay time and perform the recovery operation after lapse of an amount of time equal to the delay time.

In some embodiments of the disclosed technology, an operating method of a memory system may include determining an amount of a delay time for delaying a recovery operation upon an occurrence of a certain abnormal power event; and performing the recovery operation after the delay time.

In some embodiments of the disclosed technology, a memory system may include a power event detecting unit, a delay time determining unit and a recovering unit. The power event detecting unit may determine, after the memory system is powered on, whether a delay condition for delaying a recovery operation is satisfied based on previous recovery information upon an occurrence of a certain abnormal power event right before the memory system is powered on. The delay time determining unit may determine, in a case that the delay condition is satisfied, an amount of a delay time based on the previous recovery information, a number of new journal entries and a maximum allowable amount of recovery time. The recovering unit may perform the recovery operation after the delay time in a case that the delay condition is satisfied; or perform the recovery operation without the delay time in a case that the delay condition is not satisfied.

In some embodiments of the disclosed technology, an operating method of a memory system may include determining an amount of delay time when an abnormal power event is determined to occur and when a delay condition is satisfied; and performing a recovery operation after standing by during the amount of delay time.

In some embodiments of the disclosed technology, a memory system may include a power event detecting unit, a delay time determining unit and a recovering unit. The power event detecting unit may determine, after power-on, whether a delay condition is satisfied on a basis of previous recovery information when an abnormal power event is determined to occur right before the power-on. The delay time determining unit may determine, when the delay condition is determined as satisfied, an amount of delay time based on the previous recovery information, a number of new journal entries and a maximum allowable amount of recovery time. The recovering unit may perform a recovery operation after stand-by during the amount of delay time when the delay condition is determined as satisfied and may perform the recovery operation immediately without the stand-by when the delay condition is determined as not satisfied.

DETAILED DESCRIPTION

The technology disclosed in this patent document can be implemented in some embodiments to provide a memory system that can prolong the lifetime of memory devices in the memory system by applying different delay time periods to different memory blocks based on how often power failures occur to the memory blocks. Hereinafter, some embodiments of the disclosed technology will be described with reference to the accompanying drawings.

Figure 1:
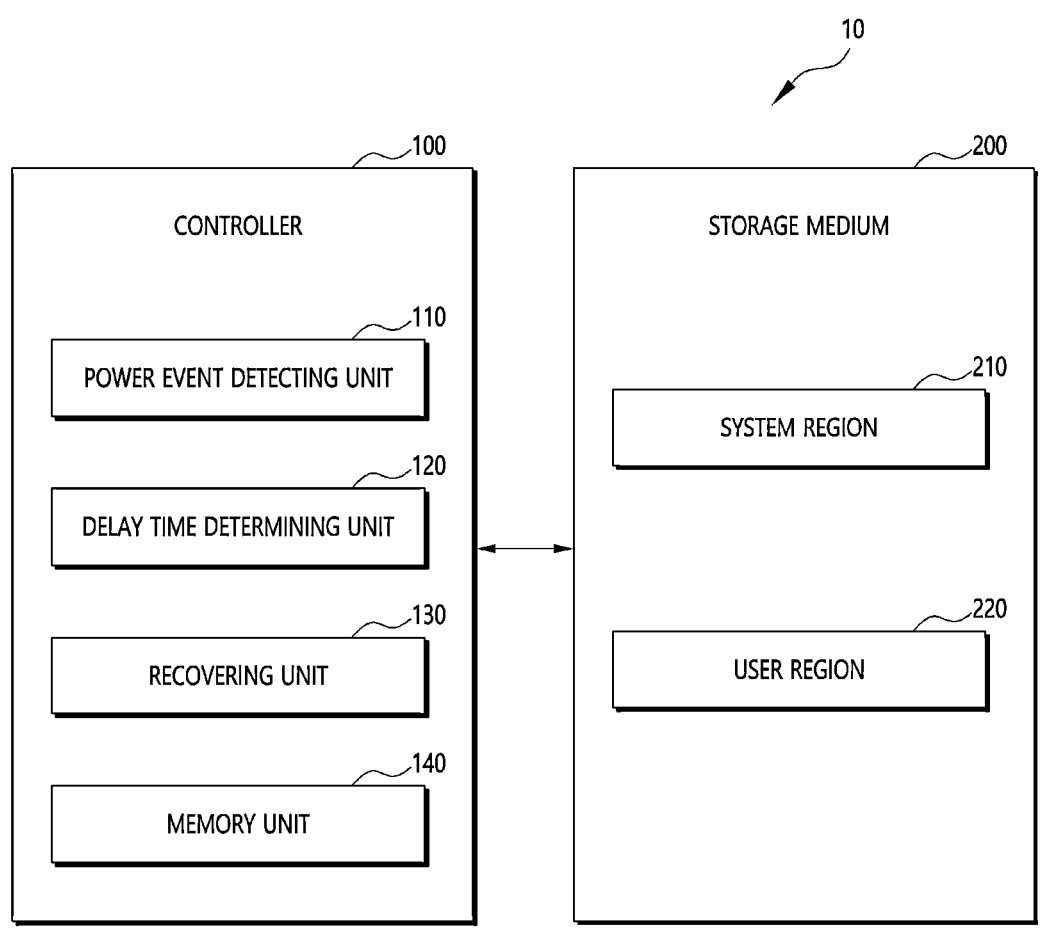
FIG. 1 is a block diagram illustrating an example of a memory system based on an embodiment of the disclosed technology.

FIG. 1 is a block diagram illustrating an example of a memory system 10 based on an embodiment of the disclosed technology.

The memory system 10 may be in a host device or in communication with the host device to store data provided from the host device in response to a write request from the host device and provide stored data to the host device in response to a read request from the host device.

The memory system 10 may be configured as a personal computer memory card international association (PCMCIA) card, a compact flash (CF) card, a smart media card, a memory stick, various multimedia cards (e.g., MMC, eMMC, RS-MMC, and MMC-micro), secure digital (SD) cards (e.g., SD, Mini-SD and Micro-SD), a universal flash storage (UFS) or a solid state drive (SSD).

The memory system 10 may include a controller 100 and a storage medium 200.

The controller 100 may control an overall operation of the memory system 10. The controller 100 may control the storage medium 200 to perform a foreground operation in response to an instruction from the host device. The foreground operation may include a write operation for writing data into the storage medium 200 and a read operation for reading data from the storage medium 200 in response to instructions (e.g., a write request and a read request) from the host device.

Furthermore, the controller 100 may control the storage medium 200 in order to perform a background operation that can be internally performed without any request from the host device. Examples of the background operation may include a wear-leveling operation, a garbage collection operation, an erase operation, a read reclaim operation, and a refresh operation for the storage medium 200. Like the foreground operation, the background operation may include write operations for writing data into the storage medium 200 and read operations for reading data from the storage medium 200.

The controller 100 may maintain meta data in a memory unit 140. For example, the meta data may include mapping information, information regarding "bad" memory regions (e.g., bad block information), valid data information, read count information and erase count information. Therefore, the meta data may be continuously updated to the most recent information while the controller 100 is operating. The memory unit 140 may be a volatile memory that operates at a high speed. Therefore, the controller 100 may periodically and/or occasionally back up or flush the most recent meta data, which is stored in the memory unit 140, into a system region 210 within the storage medium 200.

Whenever updating the meta data, the controller 100 may generate a journal entry in the memory unit 140. Each journal entry may include update information of the meta data, such as old information and new information of the meta data. For example, a journal entry that is generated as a result of the update of the mapping information among the meta data may include a logical address, an old physical address that was mapped to the logical address and a new physical address that is mapped to the logical address.

Therefore, the memory unit 140 may store therein a plurality of journal entries each including update information of the meta data. Also, the controller 100 may periodically and/or occasionally back up or flush the journal entries, which are stored in the memory unit 140, into the system region 210 within the storage medium 200. Therefore, even when only old meta data is backed up in the system region 210 and the most recent meta data could not be backed up and stored in the system region 210 at the time of an abnormal power event that causes a power failure, the controller 100 may recover the most recent meta data from the old meta data through the journal entries, which are backed up in the system region 210, after the power is restored and stabilized.

In order for the memory system to recover from an unplanned event such as the power failure, the controller 100 may store back-up information as well as the journal entry. Therefore, even when the journal entry could not be backed up from the memory unit 140 into the system region 210 at the time of an abnormal power event, the controller 100 may recover the journal entry using the back-up information after the power is restored and stabilized. For example, the controller 100 store data and a logical address corresponding to the data together in a data storage location of a new physical address. Therefore, even when none of the journal entry about the mapping information update and the most recent mapping information can be backed up, the controller 100 may recover the journal entry including the logical address, the old physical address and the new physical address by identifying the logical address stored in the data storage location of the new physical address and by identifying the old physical address mapped to the logical address from the old mapping information. Then, the controller 100 may recover the most recent mapping information based on the recovered journal entry. In this way, the controller 100 may restore the most recent mapping information using the journal entries, which are backed up in the system region 210, and the recovered journal entries.

In order to perform the above described recovery operation, the controller 100 may include a power event detecting unit 110, a delay time determining unit 120 and a recovering unit 130.

The power event detecting unit 110 may determine, when the memory system 10 is powered on, whether an abnormal power event occurred right before the memory system 10 is powered on. An abnormal power event may include sudden power loss (SPL) and sudden power off (SPO). The abnormal power event may occur when the power supply is unstable or when the power supply is interrupted.

The power event detecting unit 110 may detect an abnormal power event. When the power event detecting unit 110 determines that any abnormal power event did not occur right before the memory system 10 is powered on, the recovery operation is not performed. When the power event detecting unit 110 determines that an abnormal power event occurred right before the memory system 10 is powered on, the recovering unit 130 may perform the recovery operation.

When the power event detecting unit 110 determines that an abnormal power event occurred right before the memory system 10 is powered on, the power event detecting unit 110 may further make a determine as to whether a delay condition for a delay in performing a recovery operation is satisfied. For example, the power event detecting unit 110 may determine that the delay condition is satisfied in a case that an excessive number of abnormal power events repeatedly occur right before the memory system 10 is powered on. For example, the power event detecting unit 110 may determine the delay condition is satisfied in a case that a predetermined number of abnormal power events repeatedly occur right before the memory system 10 is powered on. In some implementations, upon satisfaction of the delay condition, the recovering unit 130 does not perform the recovery operation during a predetermined amount of delay time.

In some implementations, the power event detecting unit 110 may identify the number of repetitions of power events from previous recovery information stored in the system region 210. The power event detecting unit 110 may compare the number of repetitions of power events with a predetermined threshold value to determine whether the delay condition is satisfied. For example, the power event detecting unit 110 may determine that the delay condition is satisfied when the number of repetitions of power events is greater than the predetermined threshold value.

When the delay condition is satisfied, the delay time determining unit 120 may determine an amount of delay time based on the previous recovery information stored in the system region 210. The delay time determining unit 120 may determine that the amount of delay time is proportional to the number of repetitions of power events. The delay time determining unit 120 may determine the amount of delay time by further considering the maximum allowable amount of recovery time. The delay time determining unit 120 may transfer the determined delay time to the recovering unit 130. The delay time determining unit 120 will be described in more detail with reference to FIG. 2.

When the power event detecting unit 110 determines that the delay condition is satisfied and the delay time determining unit 120 determines the amount of delay time, the recovering unit 130 may wait for the delay time before performing the recovery operation. The recovering unit 130 may be in communication with the delay time determining unit 120 to receive information related to the delay time. After the delay time, the recovering unit 130 may perform the recovery operation. When the delay condition is not satisfied, the recovering unit 130 may perform the recovery operation without delay even if an abnormal power event occurs right before the memory system 10 is powered on. In an embodiment, in a situation where abnormal power events are repeated, the recovering unit 130 may wait for the delay time before performing the recovery operation. In this way, it is possible to prolong the lifetime of memory devices.

The recovering unit 130 may perform the recovery operation to store data that can be unstable due to an abnormal power event into another storage location and to recover the most recent meta data. For example, the recovery operation may include a read reclaim operation, a memory region erase operation, a journal replay operation and a journal entry recovery operation.

In some implementations, a read reclaim operation may include an operation of storing data that can be unstable due to an abnormal power event into another storage location. For example, when an abnormal power events occurs while the storage medium 200 is performing a write operation on a particular storage location, data stored in the particular storage location and adjacent storage locations may become unstable. Therefore, the read reclaim operation may include operations of moving the data in a memory region within the system region 210 to a new empty memory region within the system region 210 and moving the data in a memory region within a user region 220 to a new empty memory region within the user region 220.

The memory region erase operation may include an operation of generating the new empty memory region that will be utilized for the read reclaim operation. Therefore, the memory region erase operation may be performed before the read reclaim operation and may be performed as many times as the number of empty memory regions that are required for the read reclaim operation. For example, the memory region erase operation may be performed on each of the system region 210 and the user region 220.

The journal replay operation may be used to recover the most recent meta data from the old meta data that is backed up in the system region 210 by reflecting (e.g., replaying) journal entries that are backed up in the system region 210.

The journal entry recovery operation may include an operation of recovering journal entries that could not be backed up from the memory unit 140 into the system region 210. Journal entries that are recovered in the memory unit 140 through the journal entry recovery operation may be further reflected when recovering the most recent meta data from the old meta data through the journal replay operation.

The recovering unit 130 may store, into the system region 210, recovery information including a result of the recovery operation as previous recovery information. The previous recovery information may include information of the number of repetitions of power events, information regarding a recovery time, and information regarding the number of replayed journal entries. The previous recovery information may be referenced by the power event detecting unit 110 and the delay time determining unit 120 after another abnormal power event occurs again and then the memory system 10 is powered on again.

The controller 100 may further include the memory unit 140. The memory unit 140 may store therein meta data and journal entries.

The memory unit 140 may include a volatile memory apparatus. The volatile memory apparatus may include a dynamic random access memory (DRAM), a static random access memory (SRAM) and so forth.

In response to commands and control signals of the controller 100, the storage medium 200 may store therein data provided from the controller 100 and may provide data to the controller 100 during a read operation. The storage medium 200 may include the system region 210 and the user region 220. The system region 210 may store therein meta data, journal entries and previous recovery information. The user region 220 may store therein user data provided from a host device.

Each of the system region 210 and the user region 220 may include a plurality of memory regions. In some implementations, the storage medium 200 performs an erase operation on a memory region basis. That is, during the memory region erase operation, all data stored in a certain memory region may be erased.

The storage medium 200 may include one or more nonvolatile memory apparatuses. The nonvolatile memory apparatus may include a flash memory device (e.g., the NAND Flash or the NOR Flash), the Ferroelectrics Random Access Memory (FeRAM), the Phase-Change Random Access Memory (PCRAM), the Magnetic Random Access Memory (MRAM), the Resistive Random Access Memory (ReRAM) and so forth.

Figure 2:
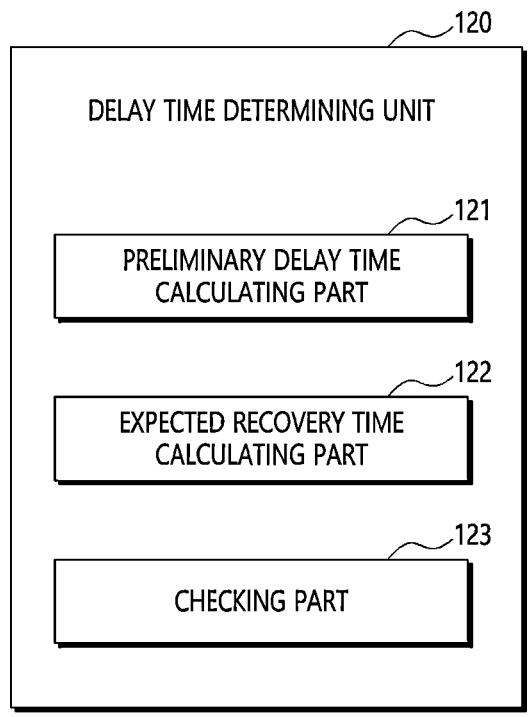
FIG. 2 is a block diagram illustrating an example of a delay time determining unit of FIG. 1.

FIG. 2 is a block diagram illustrating an example of the delay time determining unit 120 of FIG. 1.

Referring to FIG. 2, in order to determine the amount of delay time when the power event detecting unit 110 determines that the delay condition is satisfied, the delay time determining unit 120 may include a preliminary delay time calculating part 121, an expected recovery time calculating part 122 and a checking part 123.

The preliminary delay time calculating part 121 may calculate a preliminary amount of delay time based on the number of repetitions of power events included in the previous recovery information. For example, the number of repetitions of power events may be a number of abnormal power events repeatedly occur during a predetermined time period before the power-on of the memory system 10. For example, the number of repetitions of power events may be a number of times that an abnormal power event is repeated during a time period from a normal power-off of the memory system 10 to the power-on of the memory system 10.

Specifically, for example, the preliminary delay time calculating part 121 may calculate the preliminary amount of delay time to be proportional to the number of repetitions of power events. For example, the preliminary delay time calculating part 121 may calculate the preliminary amount of delay time by multiplying the number of repetitions of power events by a unit amount of delay time. For example, the preliminary delay time calculating part 121 may apply a predetermined preliminary amount of delay time to each number of repetitions of power events.

The expected recovery time calculating part 122 may calculate an expected amount of recovery time based on the previous recovery information and the number of new journal entries. Specifically, the expected amount of recovery time may be expressed as follows.

$$\text{Expected amount of recovery time} = \text{Amount of previous recovery time} + \text{Additional amount of recovery time} \quad (\text{Eq. 1})$$

$$\text{Additional amount of recovery time} = (\text{Amount of previous recovery time}/\text{Number of previous journal entries}) * \text{Number of new journal entries} \quad (\text{Eq. 2})$$

That is, the expected amount of recovery time may include an amount of previous recovery time. The amount of previous recovery time may be an amount of time taken to perform the previous recovery operation. That is, in a situation where abnormal power events repeatedly occur, the most recent meta data that was recovered through the previous recovery operation is expected to be recovered again in a similar way to the previous recovery operation and therefore the expected amount of recovery time may include the amount of previous recovery time.

The expected amount of recovery time may further include the additional amount of recovery time, i.e., an amount of time expected to be taken to replay the new journal entries.

The new journal entries may be journal entries that are newly generated and backed up and stored in the system region 210 during a time period from when the previous recover operation is completed to when an abnormal power event occurs again. The previous journal entries may be journal entries that are replayed during the previous recovery operation. Most of the amount of previous recovery time may be an amount of time taken to replay the previous journal entries. Therefore, a value obtained by dividing the amount of previous recovery time by a number of previous journal entries may be regarded as a unit amount of time taken to replay each journal entry, that is, a unit amount of replay time. Therefore, a value obtained by multiplying the unit amount of replay time by the number of new journal entries may be the additional amount of recovery time.

Although the recovery operation includes operations other than the journal replay operation, the journal replay operation is easy to estimate and occupies the most part of the recovery operation. Therefore, in an embodiment of the disclosed technology, the expected amount of recovery time may be efficiently estimated through the above equations.

The expected recovery time calculating part 122 may determine the amount of previous recovery time and the number of previous journal entries based on the previous recovery information and may determine the number of new journal entries by checking the system region 210.

The checking part 123 may check whether the preliminary amount of delay time is adequate based on the maximum allowable amount of recovery time and the expected amount of recovery time. The maximum allowable amount of recovery time may be a maximum amount of time allowed for the memory system 10 to perform the recovery operation. The maximum allowable amount of recovery time may be a predetermined value.

In some implementations, the checking part 123 may determine whether the preliminary amount of delay time is equal to or smaller than a value obtained by subtracting the expected amount of recovery time from the maximum allowable amount of recovery time. In other words, the checking part 123 may determine whether the sum of the preliminary amount of delay time and the expected amount of recovery time is equal to or smaller than the maximum allowable amount of recovery time.

The value obtained by subtracting the expected amount of recovery time from the maximum allowable amount of recovery time may be a maximum allowable amount of delay time. When the value obtained by subtracting the expected amount of recovery time from the maximum allowable amount of recovery time is smaller than a value of zero (0), the maximum allowable amount of delay time may be regarded as a value of zero (0).

When the preliminary amount of delay time is equal to or smaller than the maximum allowable amount of delay time, the checking part 123 may determine that the preliminary amount of delay time is adequate and may determine the preliminary amount of delay time as the amount of delay time. When the preliminary amount of delay time is greater than the maximum allowable amount of delay time, the checking part 123 may determine that the preliminary amount of delay time is inadequate and may determine the maximum allowable amount of delay time as the amount of delay time. The recovering unit 130 may perform the recovery operation after the stand-by during the amount of delay time that is finally determined by the checking part 123.

The technology disclosed in this patent document can be implemented in some embodiments to provide a memory system that can prolong the lifetime of memory devices in the memory system by applying different delay time periods to different memory blocks based on how often power failures occur to the memory blocks. If a power failure occurs to a certain memory block more frequently than a threshold value, the memory system can apply a longer delay time before erasing that memory block to avoid excessively frequent erase operations on the same memory block.

Figure 3:
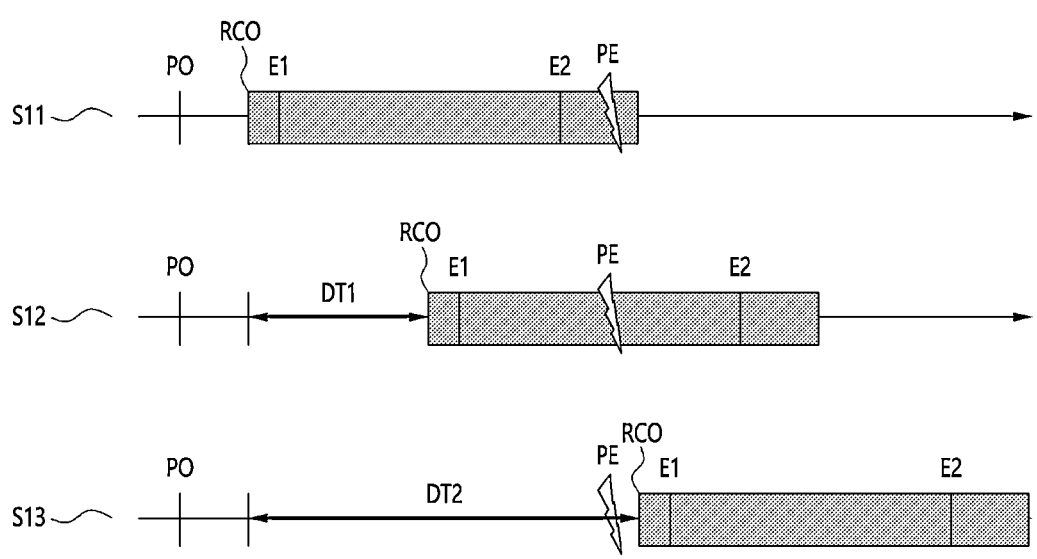
FIG. 3 is an example timing diagram when a recovering unit waits for a delay time before performing a recovery operation.

FIG. 3 is an example timing diagram illustrating three different situations (first to third situations S11, S12, S13) when the recovering unit 130 waits for a delay time before performing the recovery operation.

Referring to FIG. 3, the first situation S11 is when an abnormal power event occurs right before the power-on PO of the memory system 10 and the recovering unit 130 performs the recovery operation RCO immediately without the delay period after the power-on PO of the memory system 10. In this case, for example, two memory region erase operations E1 and E2 may be performed during the recovery operation RCO. For example, the memory region erase operations E1 and E2 may be performed on the system region 210 and the user region 220, respectively. If an abnormal power event PE occurs after the memory region erase operations E1 and E2 are performed, the power-on operation and the recovery operation may be repeatedly performed. In this case, the memory region erase operations E1 and E2 may shorten the lifetime of the memory regions because of excessively frequent erase operations.

The second situation S12 is when an abnormal power event occurs ten times right before the power-on PO of the memory system 10 and the recovering unit 130 delays the recovery operation RCO by the amount DT1 of delay time after the power-on PO of the memory system 10. In this case, the second memory region erase operation E2 may not be performed yet even when an abnormal power event PE occurs while the recovery operation RCO is being performed. In other words, the second memory region erase operation E2 may be performed if the recovery operation RCO is performed without any delay corresponding to the amount DT1 of delay time. However, because of the amount DT1 of delay time, the second memory region erase operation E2 may not be performed.

The third situation S13 is when an abnormal power event occurs twenty times right before the power-on PO of the memory system 10 and the recovering unit 130 delays the recovery operation RCO by the amount DT2 of delay time before performing the recovery operation RCO after the power-on PO of the memory system 10. Since more abnormal power events occur in the third situation S13 than in the second situation S12, the amount DT2 of delay time may be longer than the amount DT1 of delay time. In this case, the recovery operation RCO may not be performed yet even when an abnormal power event PE occurs again after the power-on PO of the memory system 10. Therefore, because of the amount DT2 of delay time, all the memory region erase operations E1 and E2 may not be performed.

To sum up, in a situation that an excessive number of abnormal power events occur, the memory region erase operations may be repeated during the recovery operation, shortening the lifetime of the memory regions. In an embodiment of the disclosed technology, in a situation that an excessive number of abnormal power events occurs, the recovery operation may be delayed by the amount of delay time, avoiding excessively frequent erase operations of the storage medium 200.

In an embodiment of the disclosed technology, in the case that the system region 210 does not store therein the previous recovery information, for example, in the case that the previous recovery information could not be stored in the system region 210 since an abnormal power event repeatedly occur within a short period of time and thus the recovery operation could not be completed, the controller 100 may not calculate the amount of delay time based on the previous recovery information and thus may perform the recovery operation without the delay time.

Figure 4:
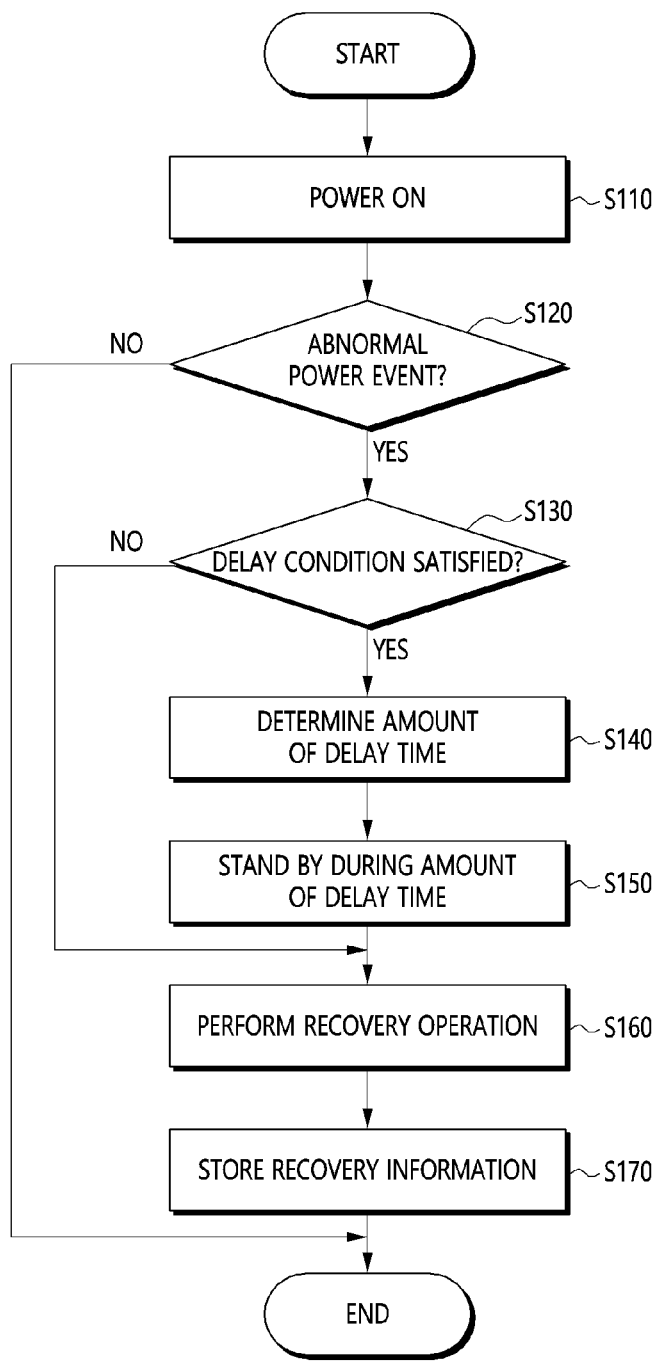
FIG. 4 is a flowchart illustrating operations that can be performed by a controller of FIG. 1 based on an embodiment of the disclosed technology.

FIG. 4 is a flowchart illustrating operations that can be performed by the controller 100 of FIG. 1 based on an embodiment of the disclosed technology.

Referring to FIG. 4, at S110, the memory system 10 may be powered on.

At S120, the power event detecting unit 110 may determine whether an abnormal power event has occurred right before the power-on of the memory system 10. When an abnormal power event has occurred right before the power-on of the memory system 10, the process may go to S130. When an abnormal power event has not occurred right before the power-on of the memory system 10, the process may end.

At S130, the power event detecting unit 110 may determine whether the delay condition is satisfied. For example, when an excessive number of abnormal power events repeatedly occur right before the power-on of the memory system 10, the power event detecting unit 110 may determine that the delay condition is satisfied. When the delay condition is satisfied, the process may go to S140. When the delay condition is not satisfied, the process may go to S160.

At S140, the delay time determining unit 120 may determine the amount of delay time.

At S150, the recovering unit 130 may delay the recovery operation by the amount of delay time.

At S160, the recovering unit 130 may perform the recovery operation.

At S170, the recovering unit 130 may store the recovery information into the system region 210.

Figure 5:
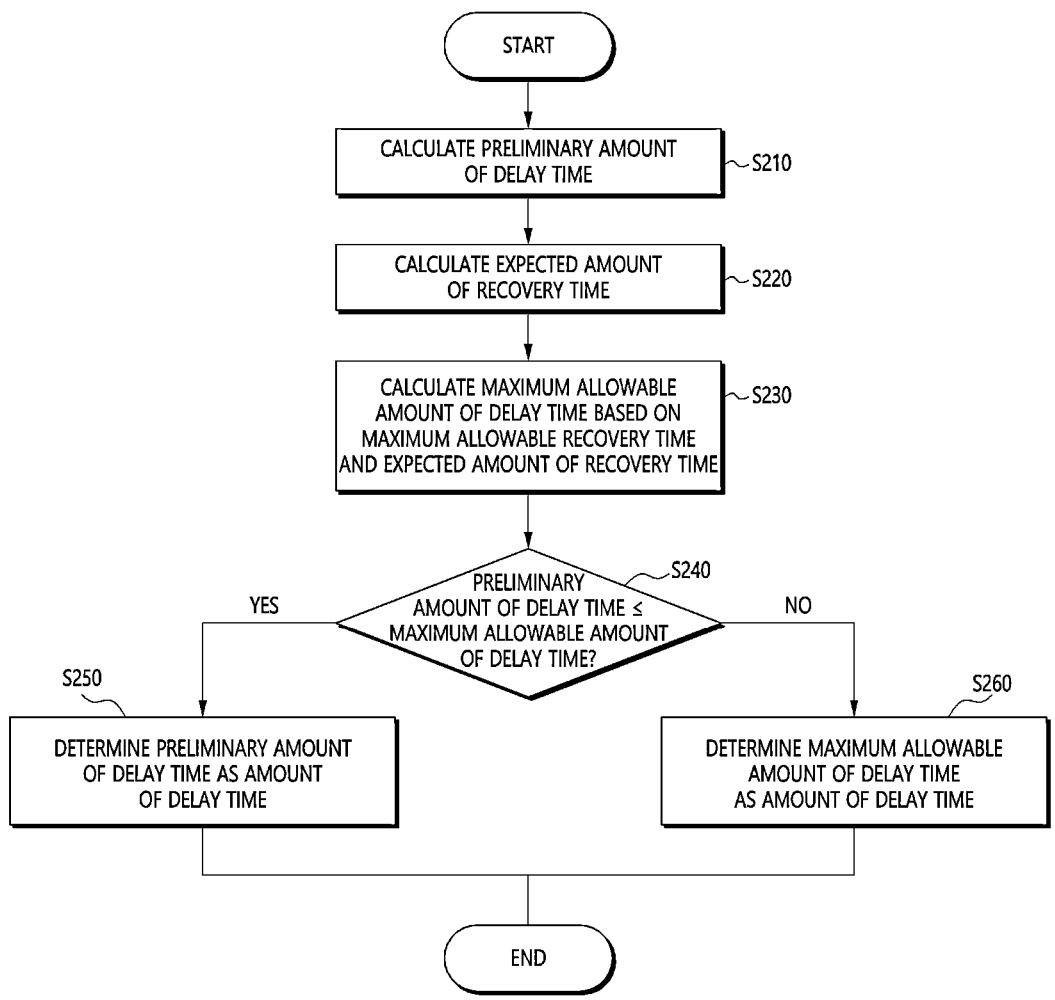
FIG. 5 is a flowchart illustrating operations that can be performed by a delay time determining unit of FIG. 2 based on an embodiment of the disclosed technology.

FIG. 5 is a flowchart illustrating operations that can be performed by the delay time determining unit 120 of FIG. 2 based on an embodiment of the disclosed technology.

Referring to FIG. 5, at S210, the preliminary delay time calculating part 121 may calculate the preliminary amount of delay time based on the number of repetitions of the abnormal power events.

At S220, the expected recovery time calculating part 122 may calculate the expected amount of recovery time based on the previous recovery information and the number of new journal entries.

At S230, the checking part 123 may calculate the maximum allowable amount of delay time based on the maximum allowable amount of recovery time and the expected amount of recovery time.

At S240, the checking part 123 may determine whether the preliminary amount of delay time is equal to or smaller than the maximum allowable amount of delay time. When the preliminary amount of delay time is equal to or smaller than the maximum allowable amount of delay time, the process may go to S250. When the preliminary amount of delay time is greater than the maximum allowable amount of delay time, the process may go to S260.

At S250, the checking part 123 may determine the preliminary amount of delay time as the amount of delay time.

At S260, the checking part 123 may determine the maximum allowable amount of delay time as the amount of delay time.

The memory system implemented based on an embodiment of the disclosed technology can avoid lifetime-shortening erase operations of a memory device by delay certain recovery operations.

Figure 6:
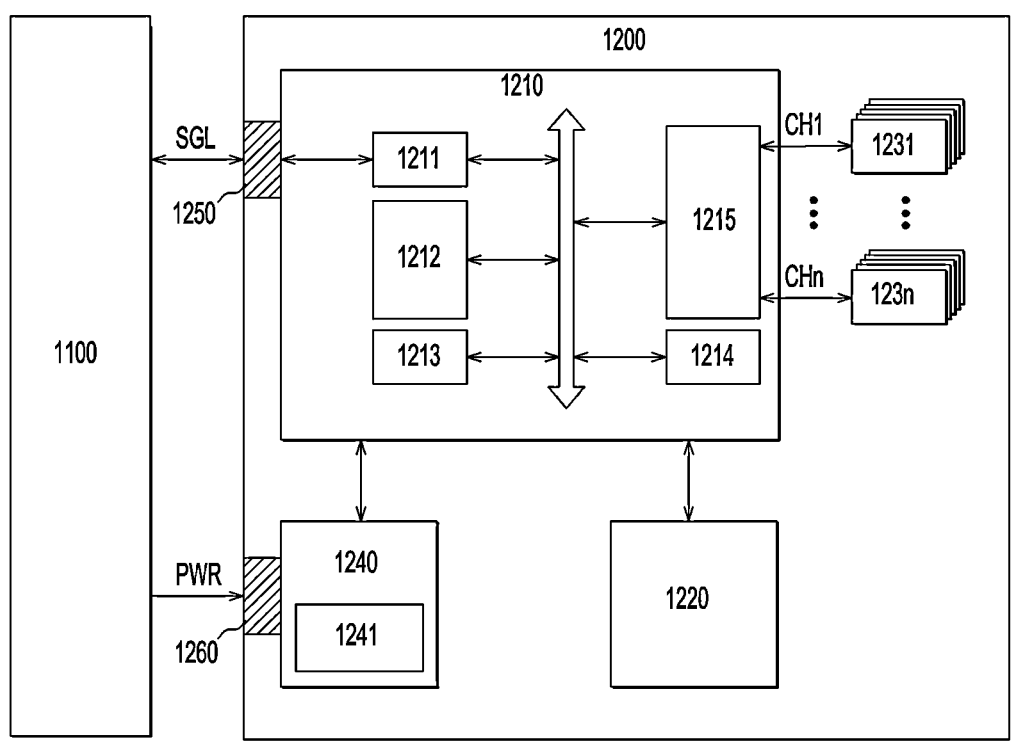
FIG. 6 is a diagram illustrating a data processing system that includes a solid-state drive (SSD) implemented based on an embodiment of the disclosed technology.

FIG. 6 is a diagram illustrating a data processing system 1000 that includes a solid-state drive (SSD) 1200 implemented based on an embodiment of the disclosed technology. Referring to FIG. 6, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E) and universal flash storage (UFS).

The control unit 1212 may process the signal SGL received from the host device 1100. The control unit 1212 may control operations of internal function blocks based on a firmware or a software for driving the SSD 1200. The random-access memory 1213 may be used as a working memory for driving such a firmware or software.

The control unit 1212 may include a power event detecting unit 110, a delay time determining unit 120 and a recovering unit 130 shown in FIG. 1. The random-access memory 1213 may include the memory unit 140 shown in FIG. 1.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, based on commands and control signals of the control unit 1212. Moreover, the memory interface unit 1215 may exchange data with at least one of the nonvolatile memory devices 1231 to 123n, based on control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n based on commands and control signals of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 7:
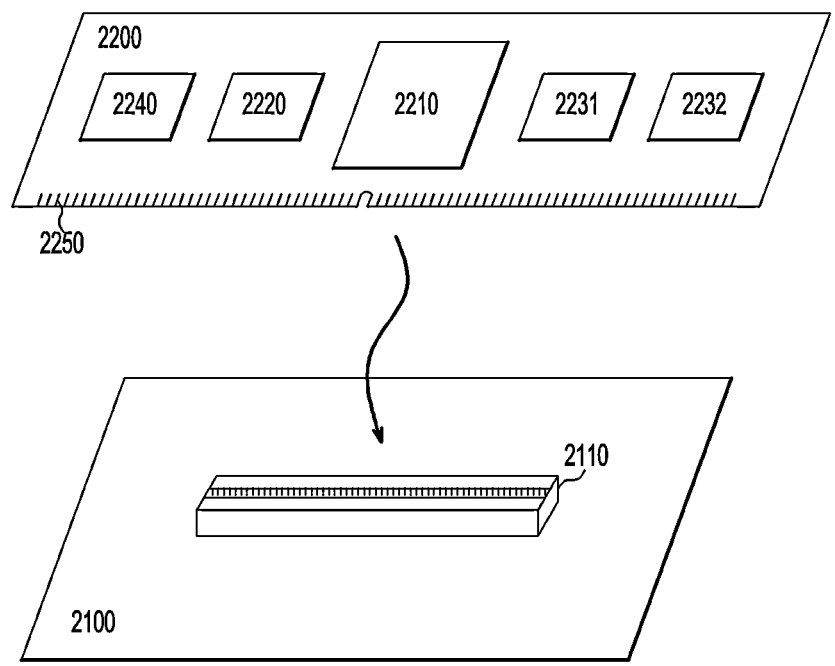
FIG. 7 is a diagram illustrating a data processing system that includes a memory system implemented based on an embodiment of the disclosed technology.

FIG. 7 is a diagram illustrating a data processing system 2000 that includes a memory system 2200 implemented based on an embodiment of the disclosed technology. Referring to FIG. 7, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 6.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 based on commands and control signals of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 based on commands and control signals of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 8:
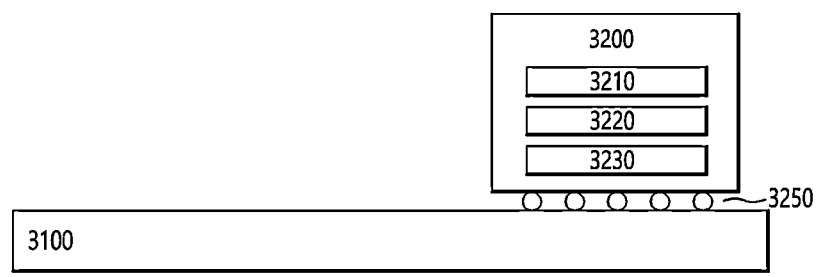
FIG. 8 is a diagram illustrating a data processing system that includes a memory system implemented based on an embodiment of the disclosed technology.

FIG. 8 is a diagram illustrating a data processing system 3000 that includes a memory system 3200 implemented based on an embodiment of the disclosed technology. Referring to FIG. 8, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 6.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 based on commands and control signals of the controller 3210.

The nonvolatile memory device 3230 may be used as the storage medium of the memory system 3200.

Figure 9:
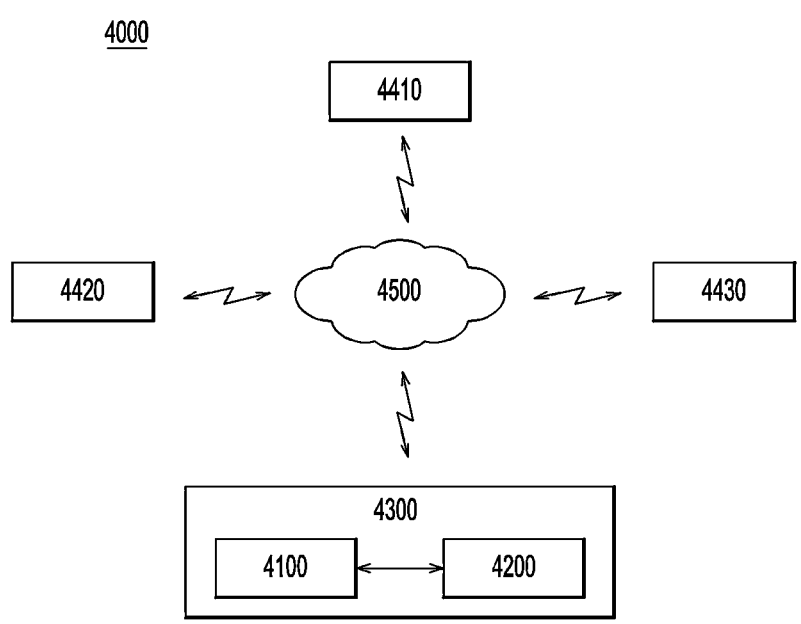
FIG. 9 is a diagram illustrating a network system that includes a memory system implemented based on an embodiment of the disclosed technology.

FIG. 9 is a diagram illustrating a network system 4000 that includes a memory system 4200 implemented based on an embodiment of the disclosed technology. Referring to FIG. 9, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 10 shown in FIG. 1, the SSD 1200 shown in FIG. 6, the memory system 2200 shown in FIG. 7 or the memory system 3200 shown in FIG. 8.

Figure 10:
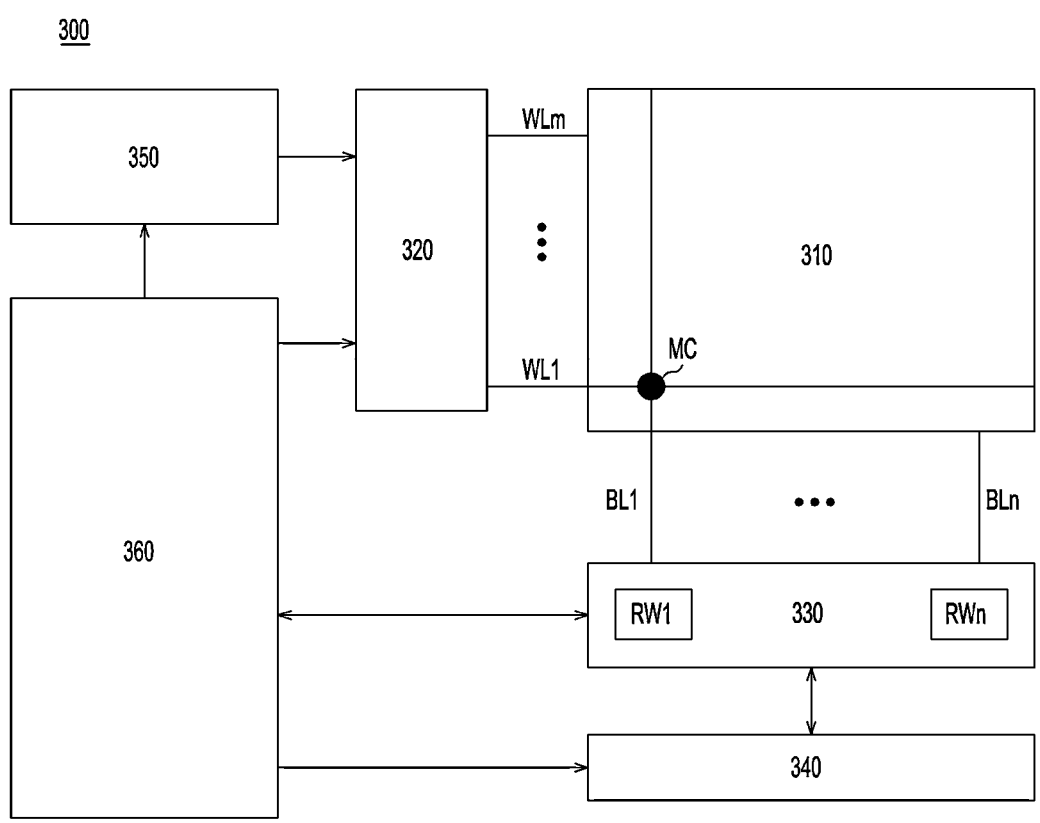
FIG. 10 is a block diagram illustrating a nonvolatile memory device included in a memory system based on an embodiment of the disclosed technology.

FIG. 10 is a block diagram illustrating a nonvolatile memory device 300 included in a memory system based on an embodiment of the disclosed technology. Referring to FIG. 10, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate based on commands and control signals of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate based on commands and control signals of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate based on commands and control signals of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

The technical features disclosed in this patent document can be implemented in various configurations or ways and the disclosed embodiments are merely examples of certain implementations. Various enhancements of the disclosed embodiments and other embodiments can be made based on what is disclosed and/or illustrated in this patent document.

What is claimed is:

1. A memory system comprising:
 a power event detecting unit configured to determine whether a delay condition is satisfied upon an occurrence of a certain abnormal power event by comparing a number of repetitions of the certain abnormal power event with a predetermined threshold value, wherein the delay condition is satisfied when the number of repetitions of the certain abnormal power event is greater than the predetermined threshold value;
 a delay time determining unit configured to determine an amount of a delay time for delaying a recovery operation when the delay condition is satisfied; and
 a recovering unit in communication with the delay time determining unit to receive information related to the delay time and configured to perform the recovery operation after lapse of an amount of time equal to the delay time.

2. The memory system of claim 1, wherein the delay time determining unit is configured to determine the amount of delay time by:
 calculating a maximum allowable amount of delay time based on a maximum allowable amount of recovery time and an expected amount of recovery time; and
 comparing the maximum allowable amount of delay time with a preliminary amount of delay time.

3. The memory system of claim 2, wherein the delay time determining unit is configured to calculate the preliminary amount of delay time based on the number of repetitions of the certain abnormal power event.

4. The memory system of claim 2, wherein the delay time determining unit is configured to calculate the expected amount of recovery time based on previous recovery information and a number of new journal entries.

5. The memory system of claim 2, wherein the delay time determining unit is configured to calculate the expected amount of recovery time using the following equation:

Expected amount of recovery time=Amount of previous recovery time+(Amount of previous recovery time/Number of previous journal entries)*Number of new journal entries.

6. The memory system of claim 2, wherein the delay time determining unit is configured to determine, as the amount of delay time, one of the maximum allowable amount of delay time and the preliminary amount of delay time by comparing the maximum allowable amount of delay time with the preliminary amount of delay time.

7. An operating method of a memory system, the operating method comprising:
   determining whether a delay condition is satisfied upon an occurrence of a certain abnormal power event by comparing a number of repetitions of the certain abnormal power event with a predetermined threshold value, wherein the delay condition is satisfied when the number of repetitions of the certain abnormal power event is greater than the predetermined threshold value;
   determining an amount of a delay time for delaying a recovery operation when the delay condition is satisfied and
   performing the recovery operation after the delay time.

8. The operating method of claim 7, wherein the determining of the amount of delay time includes determining the amount of delay time by:
   calculating a maximum allowable amount of delay time based on a maximum allowable amount of recovery time and an expected amount of recovery time; and
   comparing the maximum allowable amount of delay time with a preliminary amount of delay time.

9. The operating method of claim 8, wherein the determining of the amount of delay time further includes calculating the preliminary amount of delay time based on the number of repetitions of the certain abnormal power event.

10. The operating method of claim 8, wherein the determining of the amount of delay time further includes calculating the expected amount of recovery time based on previous recovery information and a number of new journal entries.

11. The operating method of claim 8, wherein the determining of the amount of delay time further includes calculating the expected amount of recovery time using the following equation:

Expected amount of recovery time=Amount of previous recovery time+(Amount of previous recovery time/Number of previous journal entries)*Number of new journal entries.

12. The operating method of claim 8, wherein the determining of the amount of delay time further includes determining, as the amount of delay time, one of the maximum allowable amount of delay time and the preliminary amount of delay time by comparing the maximum allowable amount of delay time with the preliminary amount of delay time.

13. A memory system comprising:
   a power event detecting unit configured to determine, after the memory system is powered on, whether a delay condition for delaying a recovery operation is satisfied upon an occurrence of a certain abnormal power event right before the memory system is powered on by comparing a number of repetitions of the certain abnormal power event with a predetermined threshold value, wherein the delay condition is satisfied when the number of repetitions of the certain abnormal power event is greater than the predetermined threshold value;
   a delay time determining unit configured to determine, in a case that the delay condition is satisfied, an amount of a delay time based on previous recovery information, a number of new journal entries and a maximum allowable amount of recovery time; and
   a recovering unit configured to: perform the recovery operation after the delay time in a case that the delay condition is satisfied; or perform the recovery operation without the delay time in a case that the delay condition is not satisfied.

14. The memory system of claim 13, wherein the previous recovery information includes at least one of the number of repetitions of the certain abnormal power event, an amount of previous recovery time and a number of previous journal entries.

15. The memory system of claim 14, wherein the delay time determining unit is configured to determine the amount of delay time by:
   determining a preliminary amount of delay time based on the number of repetitions of the certain abnormal power event,
   calculating an expected amount of recovery time based on the amount of previous recovery time, the number of previous journal entries and the number of new journal entries,
   calculating a maximum allowable amount of delay time based on the maximum allowable amount of recovery time and the expected amount of recovery time, and
   comparing the maximum allowable amount of delay time and the preliminary amount of delay time.

* * * * *